United States Patent
Parthasarathy et al.

(10) Patent No.: US 9,472,630 B2
(45) Date of Patent: Oct. 18, 2016

(54) DEPOSIT/ETCH FOR TAPERED OXIDE (71) Applicant: Power Integrations, Inc., San Jose, CA (US)

(72) Inventors: Vijay Parthasarathy, Sunnyvale, CA (US); Sujit Banerjee, San Jose, CA (US); Wayne B. Grabowski, Los Altos, CA (US)

(73) Assignee: Power Integrations, Inc., San Jose, CA (US)

( * ) Notice: Subject to any disclaimer, the term of this patent is extended or adjusted under 35 U.S.C. 154(b) by 340 days.

(21) Appl. No.: 14/184,554

(22) Filed: Feb. 19, 2014

(65) Prior Publication Data

US 2014/0187019 A1 Jul. 3, 2014

Related U.S. Application Data

(63) Continuation of application No. 13/558,218, filed on Jul. 25, 2012, now Pat. No. 8,765,609.

(51) Int. Cl.
*H01L 29/40* (2006.01)
*H01L 21/762* (2006.01)

(52) U.S. Cl.
CPC ....... *H01L 29/407* (2013.01); *H01L 21/76224* (2013.01)

(58) Field of Classification Search
CPC ................... H01L 29/7813; H01L 29/42368; H01L 29/407; H01L 21/76224
See application file for complete search history.

(56) References Cited

U.S. PATENT DOCUMENTS

| | | | |
|---|---|---|---|
| 3,374,406 A | 3/1968 | Wallmark | |
| 3,374,407 A | 3/1968 | Olmstead | |
| 4,690,729 A | 9/1987 | Douglas | |
| 4,914,058 A | 4/1990 | Blanchard | |
| 4,984,039 A | 1/1991 | Douglas | |
| 5,010,378 A | 4/1991 | Douglas | |
| 5,620,910 A | 4/1997 | Teramoto | |
| 5,637,898 A | 6/1997 | Baliga | |
| 6,191,447 B1 | 2/2001 | Baliga | |
| 6,365,462 B2 * | 4/2002 | Baliga | H01L 29/42368 257/E21.359 |
| 6,649,477 B2 | 11/2003 | Blanchard et al. | |

(Continued)

FOREIGN PATENT DOCUMENTS

DE 102005043916 B3 12/2006

OTHER PUBLICATIONS

Non Final Office Action received for U.S. Appl. No. 13/558,218, mailed on Mar. 6, 2013, 12 pages.

(Continued)

*Primary Examiner* — Anthony Ho
*Assistant Examiner* — Victor Barzykin
(74) *Attorney, Agent, or Firm* — Blakely Sokoloff Taylor & Zafman LLP (57) ABSTRACT

A process for fabricating a tapered field plate dielectric for high-voltage semiconductor devices is disclosed. The process may include depositing a thin layer of oxide, depositing a polysilicon hard mask, depositing a resist layer and etching a trench area, performing deep silicon trench etch, and stripping the resist layer. The process may further include repeated steps of depositing a layer of oxide and anisotropic etching of the oxide to form a tapered wall within the trench. The process may further include depositing poly and performing further processing to form the semiconductor device.

8 Claims, 10 Drawing Sheets

(56) References Cited

U.S. PATENT DOCUMENTS

| | | | |
|---|---|---|---|
| 6,686,244 | B2 | 2/2004 | Blanchard |
| 6,787,848 | B2 | 9/2004 | Ono et al. |
| 6,815,293 | B2 | 11/2004 | Disney et al. |
| 6,987,299 | B2 | 1/2006 | Disney et al. |
| 7,045,426 | B2 | 5/2006 | Ono et al. |
| 7,719,053 | B2 | 5/2010 | Nakamura |
| 7,736,976 | B2 | 6/2010 | Blanchard et al. |
| 7,994,017 | B2 | 8/2011 | Harris et al. |
| 8,049,271 | B2 | 11/2011 | Blanchard et al. |
| 8,092,697 | B2 | 1/2012 | Branton et al. |
| 8,125,045 | B2 | 2/2012 | Akiyama |
| 8,269,282 | B2 | 9/2012 | Wood et al. |
| 8,299,472 | B2 | 10/2012 | Yu et al. |
| 2001/0000033 | A1 | 3/2001 | Baliga |
| 2002/0166838 | A1 | 11/2002 | Nagarajan |
| 2005/0106835 | A1* | 5/2005 | Layadi ............ H01L 21/823481 438/424 |
| 2006/0145247 | A1* | 7/2006 | Zundel ................ H01L 29/1095 257/330 |
| 2007/0069257 | A1* | 3/2007 | Mauder ................ H01L 29/407 257/288 |
| 2009/0273024 | A1 | 11/2009 | Hiller et al. |
| 2010/0006931 | A1 | 1/2010 | Denison |
| 2010/0264486 | A1 | 10/2010 | Denison et al. |
| 2011/0006362 | A1 | 1/2011 | Hsieh |
| 2011/0275210 | A1 | 11/2011 | Denison et al. |
| 2012/0184095 | A1 | 7/2012 | Poelzl |
| 2012/0309147 | A1 | 12/2012 | Wood et al. |

OTHER PUBLICATIONS

Notice of Allowance received for U.S. Appl. No. 13/558,218, mailed on Nov. 12, 2013, 12 pages.

Chen et al., "Design of Gradient Oxide-Bypassed Superjunction Power MOSFET Devices", IEEE Transactions on Power Electronics, vol. 22, No. 4, Jul. 2007, pp. 1303-1310.

International Search Report and Written Opinion received for PCT Patent Application No. PCT/US2013/050046, mailed on Dec. 3, 2013, 16 pages.

International Preliminary Report on Patentability received for PCT Patent Application No. PCT/US2013/050046, mailed on Feb. 5, 2015, 11 pages.

* cited by examiner

DEPOSIT/ETCH FOR TAPERED OXIDE

CROSS-REFERENCE TO RELATED APPLICATIONS

This application is a continuation of U.S. application Ser. No. 13/558,218, filed Jul. 25, 2012, entitled DEPOSIT/ETCH FOR TAPERED OXIDE. The entire contents of which is hereby incorporated by reference in its entirety and for all purposes.

BACKGROUND

1. Field

The present disclosure relates generally to the fabrication of field plate dielectrics for high-voltage semiconductors, and, more specifically, the present disclosure relates to the fabrication of tapered field plate dielectric for high-voltage semiconductor devices.

2. Description of Related Art

Electronic devices use power to operate. Power is generally delivered through a wall socket as high voltage alternating current (ac). A device, typically referred to as a power converter or as a power supply, can be utilized to transform the high voltage ac input into a well regulated direct current (dc) output through an energy transfer element. One type of power converter is a switch mode power converter which is commonly used due to its high efficiency, small size, and low weight to power many of today's electronics. Many switch mode power converters that provide electricity to electronics such as tablet computers, smart phones, and LED lights rely on power semiconductor devices that can handle high-voltages. For example, semiconductor devices in cell phone chargers may be required to handle peak voltages of up to 600 V without breaking down. Some of these high-voltage devices handle high voltages by spreading electric fields over larger areas of semiconductor, which prevents electric fields from exceeding breakdown thresholds. To aid in the spreading of the electrical fields, sometimes field plates are used.

Figure 1:
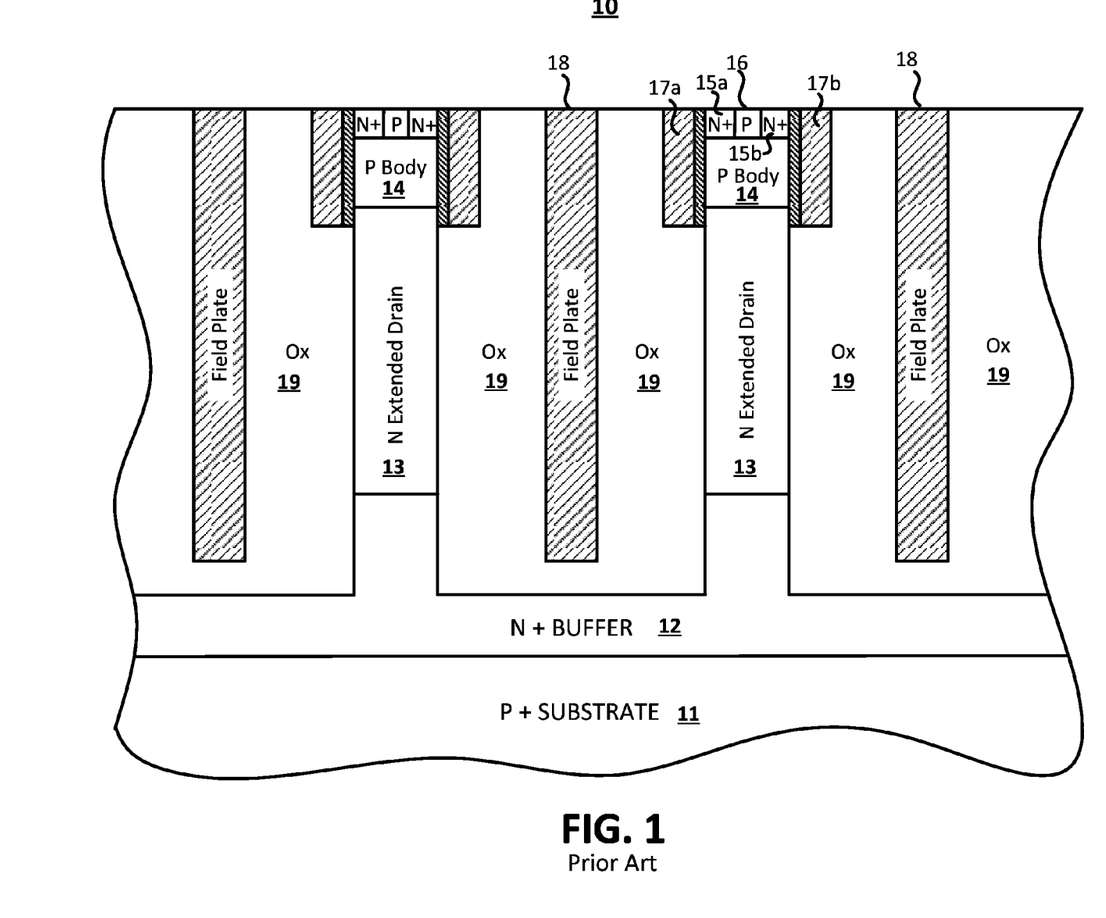
FIG. 1 depicts an example HVFET with a field plate.

One type of high voltage transistor is a vertical thin silicon (VTS) high voltage field effect transistor (HVFET). For example, FIG. 1 depicts an example VTS HVFET 10 built on wafer 11. VTS HVFET 10 includes source regions 15a and 15b, body region 14, and drain regions 12 and 13 (which include a long drain extension) in a silicon pillar. A potential applied to gates 17a and 17b may modulate a channel in body region 14 and control conduction between source regions 15a and 15b and drain regions 12 and 13. The potential of body region 14 may be controlled by body contact 16. HVFET 10 also has field plate 18 separated from the silicon pillar by field plate dielectric 19. Field plate 18 allows for an increase in breakdown voltage by spreading high voltage drops over larger areas in the extended drain region (i.e., spreading out electric fields).

DESCRIPTION OF THE FIGURES

Non-limiting and non-exhaustive embodiments of the present invention are described with reference to the following figures, wherein like reference numerals refer to like parts throughout the various views unless otherwise specified.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As discussed above, FIG. 1 depicts field plate 18 with field plate dielectric 19 that is substantially the same thickness along the depth of field plate 18. To develop a reliable device optimally it may be suitable to maintain a constant electric field along extended drain region 13. In order to maintain a constant electric field pillar, a graded doping profile for the extended drain region 13 may be necessary. In particular, the graded doping of drain region 13 may be gradually reduced along the depth as the surface of VTS device 10 is approached. In this manner, VTS device 10 is able to deplete between the extended drain region 13 and oxide 19 such that VTS device 10 is capable of supporting the maximum breakdown voltage. However, one disadvantage of having a graded doping profile may be having lighter doping closer to the surface of VTS device 10 that may cause a higher specific resistance and reduced efficiency. As shown in the figures and described below, the field plate dielectric thickness is varied along the depth of the device. In particular, the oxide thickness is minimal at the surface and increases along the depth of the device 10 until it approaches the bottom which allows for increased doping of extended drain region 13 near the surface of VTS device 10. As a result, the specific resistance of VTS device 10 may be reduced by a factor of up to 3 to 4 times. In one example, specific on resistance may be defined as the resistance that is inherent, based on material and design of the semiconductor, when there is substantially zero volts between the drain and source of VTS device 10. It may be appreciated that to improve efficiency of the semiconductor device, the specific resistance may be reduced to reduce power dissipation when the device is conducting. In one example, a varying thickness of the field plate dielectric could be accomplished by tapering. In this manner, a constant distribution of doping may be accomplished. An example process for forming a tapered field plate dielectric in a semiconductor substrate is described below. This example process may be useful with processes that form a variety of types of devices, such as Schottky diodes, HVFETs, JFET, IGBT, bipolar transistors and the like. The tapered field plate dielectric fabrication is described with respect to figures depicting various stages of the example process. For ease of discussion, the example process is described with respect to the fabrication of one field plate dielectric region. However, it should be understood that only a portion of the substrate is depicted according to the Figures. In practice, many devices (e.g., HVFETs) with field plates having tapered field plate dielectric regions are formed in parallel across the substrate.

Figure 2A:
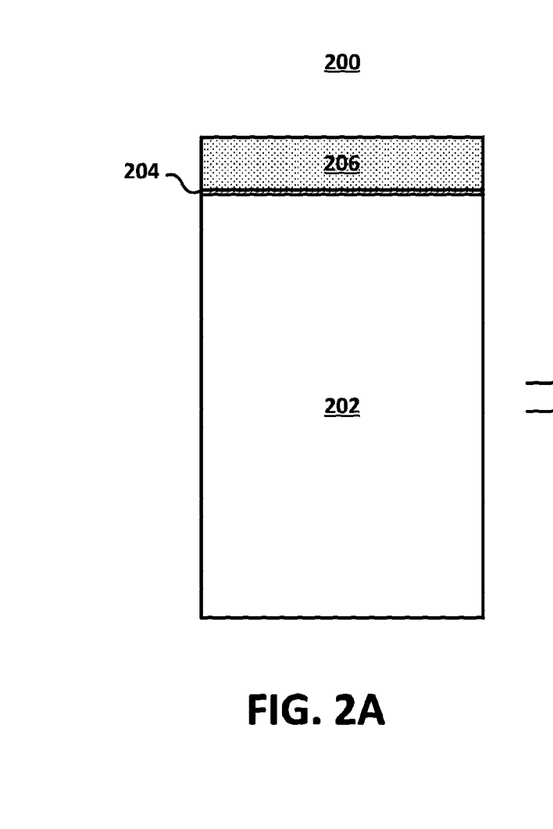
FIGS. 2A-2C depict the formation of a hardmask according to an example process for forming a tapered field plate dielectric region.

FIG. 2A depicts substrate 200, which includes wafer 202, protective layer 204, and mask layer 206. Wafer 202 may be made of a variety of materials, such as, for example, silicon, silicon carbide, diamond, gallium arsenide, aluminum gallium arsenide, indium phosphide, gallium nitride, and the like. Wafer 202 may also be made of multiple different materials to form a hetero structure. Wafer 202 may also be formed of a base wafer (e.g., a silicon wafer) with other layers (e.g., epitaxilally grown layers) grown on top of the base wafer. In one example, wafer 202 may be a thickness of 700-1000 µm.

As shown, protective layer 204 is deposited on the surface of wafer 202 to protect the surface of wafer 202 from defects and damage during processing. Protective layer 204 and mask layer 206 may be optional in some variations of the example process. In a simpler process, the tapered oxide can be formed without mask layer 206 and the silicon pillar itself may be used as the hard mask for the oxide. In variations of the example process that use a silicon wafer for wafer 202, protective layer 204 may be, for example, thermally grown oxide with a thickness of about 200 Å.

Mask layer 206 may be a hard mask (e.g., polysilicon, nitride, and the like). Mask layer 206 may be selected to have different etching properties as the insulating material that will be used to form the field plate dielectric. By choosing mask layer 206 to have different etching properties than the field plate dielectric, an etch with a high selectivity to the field plate dielectric material over mask layer 206 may be used, which allows for mask layer 206 to be used throughout the formation of the tapered field plate dielectric. For example, poly silicon may be used for mask layer 206. If the field plate dielectric material will be oxide, then it should be possible to select an etch recipe that has an etch selectivity of oxide to silicon of 10:1 or 20:1. In one example, mask layer 206 may be about 2-5 µm thick, although other thickness may be possible depending on the selectivity of the etch recipe used for etching the field plate dielectric material.

Figure 2B:
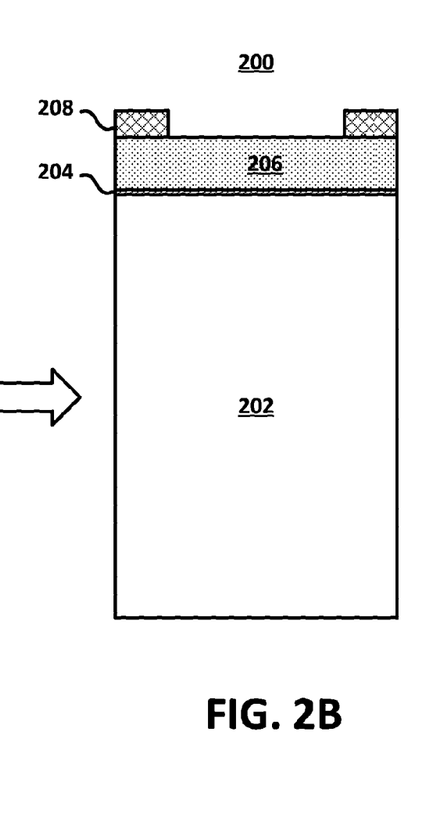

FIG. 2B depicts substrate 200 after mask layer 208 has been deposited and patterned to define the location of the trench and field plate dielectric adjacent the silicon pillar where the semiconductor device will be located (these pillars will roughly be under the remaining portions of mask layer 208). Mask layer 208 is a photo resist mask. In another example, protective layer 204 and mask layer may not be used and photoresist layer may be deposited directly on surface of silicon wafer 202.

Figure 2C:
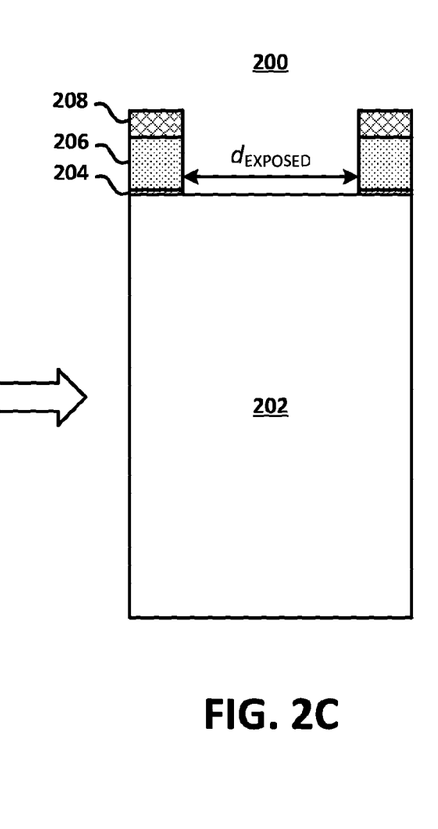

FIG. 2C depicts substrate 200 after mask layer 206 and protective layer 204 have been etched to expose the surface of wafer 202 in the region where the trench will be etched, as defined by mask layer 208. In one example, the exposed portion of waver 202 is $d_{EXPOSED}$ and may be about 10-12 µm wide.

Figure 3A:
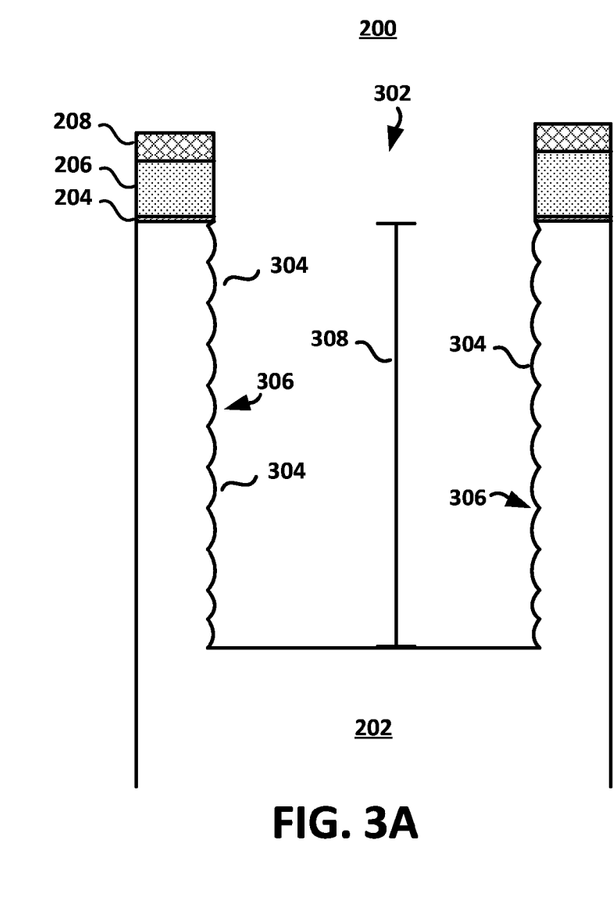
FIGS. 3A and 3B depict the etching of a trench according to the example process for forming the tapered field plate dielectric region.

FIG. 3A depicts substrate 200 after a trench 302 has been formed. In one example, a deep reactive ion etch (DRIE) step is used, which results in the formation of scallops 304 on the sidewalls 306 of trench 302. Trench 302 may be etched to depth 308, which, in one example, may be about 60 µm deep. It should be appreciated that other etch techniques to etch trench 302 may be used that do not form scallops.

Figure 3B:
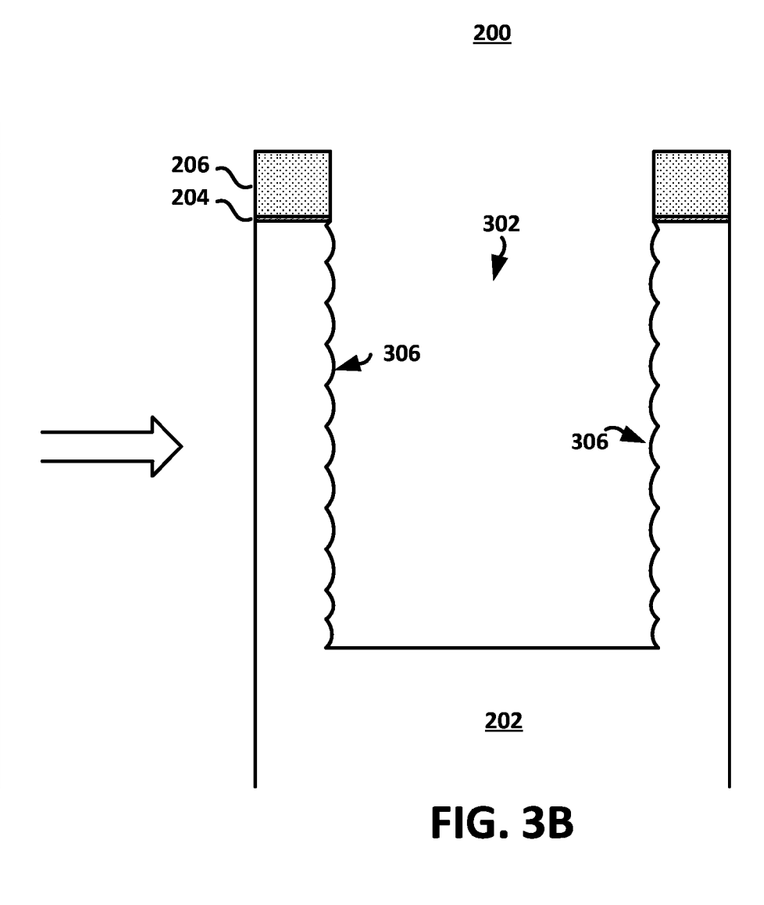
Figure 4A:
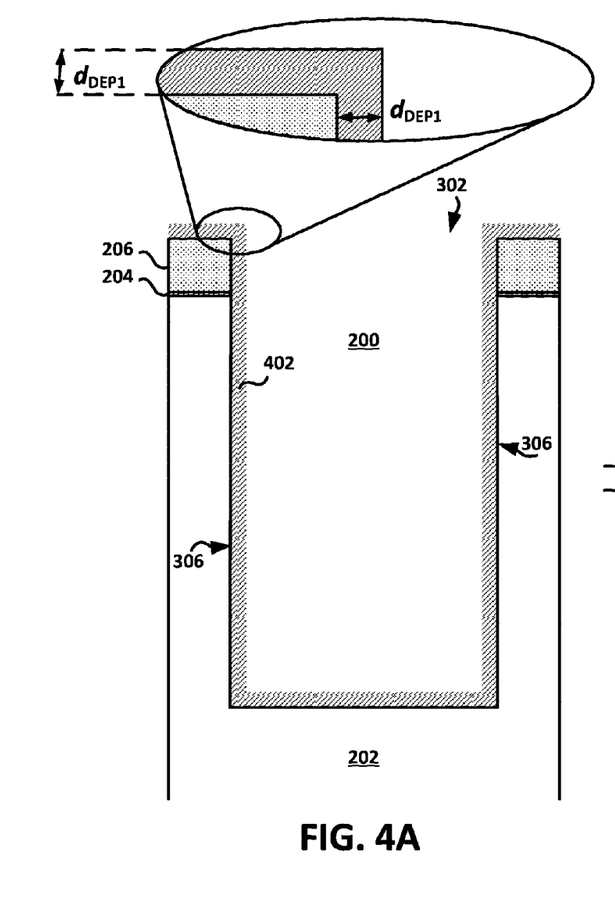
FIGS. 4A and 4B depict a first cycle of deposition and etching of an insulating layer according to the example process for forming the tapered field plate dielectric region.

FIG. 3B depicts substrate 200 after mask layer 208 has been removed. Removing mask layer 208 may be accomplished with various steps. For example, if mask layer 208 is a photoresist mask, then a plasma ashing step may be used. In another example, if nitride or oxide are used, a phosphoric acid or hydrofluoric acid, respectively, etch step may be used. FIG. 4A depicts substrate 200 after insulating layer 402 is deposited. As stated above, field plate dielectric comprises of one or more insulating layers 402. The process for depositing insulating layer 402 may be conformal so that approximately a thickness of $d_{DEP1}$ of insulating material is present on exposed surfaces which are both vertical (e.g., sidewalls 306) and horizontal surfaces (e.g., the bottom of trench 302 and on top of mask layer 206). Insulating layer 402 may be silicon dioxide, silicon nitride, boron phosphide silicate glass, and the like. Processes, such as low pressure chemical vapor deposition, high density plasma, plasma enhanced chemical vapor deposition, and the like, may be used to deposit insulating layer 402. The thickness $d_{DEP1}$ may be determined in response to temperature, time, and light in processes. In another example $d_{DEP1}$ is approximately 0.5 µm.

Figure 4B:
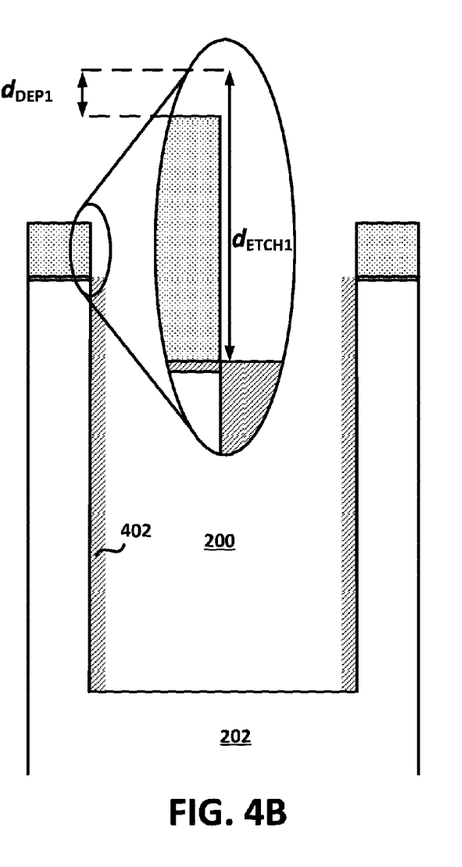

FIG. 4B depicts substrate 200 after etching a thickness, $d_{ETCH1}$ of insulating layer 402 with a highly anisotropic etch. In other words, horizontal surfaces of the substrate are etched substantially more than vertical surfaces. For example, the etch ratio of vertical to horizontal, which may also be known as directionality of the etch, can be 100 to 1. In one example, $d_{ETCH1}$ may be a distance of 4 µm in the vertical direction. The etch recipe used for etching insulating layer 402 may be selected such that the etch rate of insulating layer 402 is much higher than the etch rate of mask layer 206 or wafer 202. If the selectively of the etch recipe is high enough, the same mask layer 206 may be used throughout the process of forming the tapered field plate dielectric. Additionally, if the same material is used for semiconductor wafer 202 and mask layer 206 (e.g., a silicon wafer and a poly silicon mask), then the etch recipe for etching insulating layer 402 may have a similar selectivity for the material of insulating layer 402 over both the exposed portions of semiconductor wafer 202 at the bottom of trench 302 and mask layer 206 at the surface of semiconductor wafer 202. For example, a selectivity of at least 10:1 or even 20:1 may be used.

As shown in FIG. 4B, $d_{ETCH1}$ may be greater than $d_{DEP1}$ such that the portions of insulating layer 402 on horizontal surfaces (e.g. top surface of mask layer 202 and bottom portion of trench 302) will be completely removed. However, the portions of insulating layer 402 on vertical surfaces will be etched down by approximately $d_{ETCH1}$ or in some cases, an amount less than $d_{ETCH1}$, as depicted on sidewalls 306 of trench 302. In other words, only an upper portion, which is proportional in depth to $d_{ETCH1}$, of insulating layer 402 on vertical surfaces is removed (e.g., the portion of insulating layer 402 on the sidewalls 306 in trench 302).

Note that scallops 304 do not appear in FIG. 4A. The scallops may be removed from the sidewalls of trench 302 prior to the deposition of insulating layer 402. For example, if wafer 202 is silicon, then a thermal oxidation step may be used to consume the scallops and an oxide removal step may be used to remove the thermal oxide leaving a smoother sidewall. Alternatively, in variations of the example process, the scallops may remain. In other variations of the example process, the scallops may not be present due to the trench etch technique used or the scallops may be small enough that the scallops are not readily apparent or of concern.

Figure 5A:
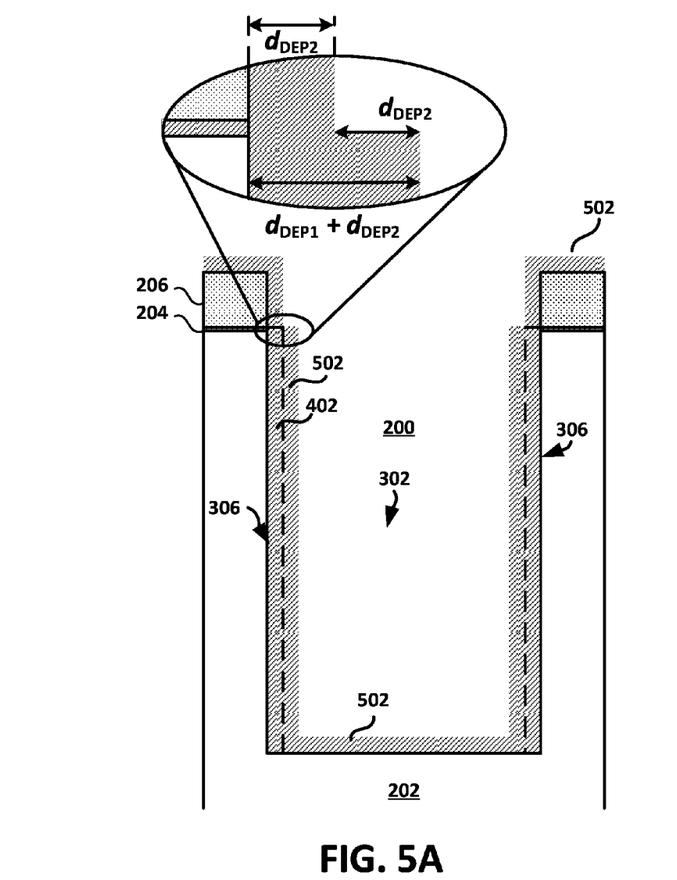
FIGS. 5A and 5B depict a second cycle of deposition and etching of an insulating layer according to the example process for forming the tapered field plate dielectric region.

FIG. 5A depicts substrate 200 after insulating layer 502 has been deposited on substrate 202. Insulating layer 502 may be deposited on top of insulating layer 402 on sidewalls 306 of trench 302 where insulating layer 402 had not been previously removed. The process for depositing insulating layer 502 may be conformal so that approximately a thickness of $d_{DEP2}$ of insulating material 502 is deposited on both vertical and horizontal surfaces. Insulating layer 502 may be the same material deposited with the same technique to the same thickness as insulating layer 402. In one alternative, as compared to insulating layer 402, insulating layer 502 may be a different material, deposited with a different technique, or have a different thickness. Portions of sidewalls 306 that did not have insulating layer 402 removed may now have approximately a total thickness of $d_{DEP1}+d_{DEP2}$ of insulating material. However, portions of wafer 202 that are exposed at the bottom of trench 302 have a thickness of only approximately $d_{DEP2}$ of insulating material. In one example, thickness $d_{DEP1}$ of insulating layer 402 is substantially the same as thickness $d_{DEP2}$ of insulating layer 502. In another example, thickness $d_{DEP1}$ and $d_{DEP2}$ of insulating layers 402 and 502 are different.

Figure 5B:
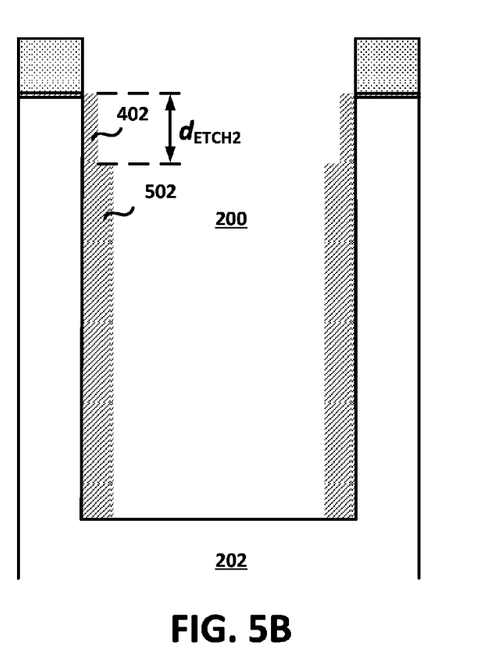

FIG. 5B depicts substrate 200 after etching a thickness, $d_{ETCH2}$, of insulating layer 502 and some of insulating layer 402 with an anisotropic etch (e.g., the same etch used to etch insulating layer 402 as discussed with respect to FIG. 4B). In particular, an upper portion of insulating layer 502 on the sidewall of mask 206 and on the sidewall of trench 302 (on insulating layer 402) has been etched. There is now a pillar of insulating layer 502 on a pillar of insulating layer 402.

Figure 6A:
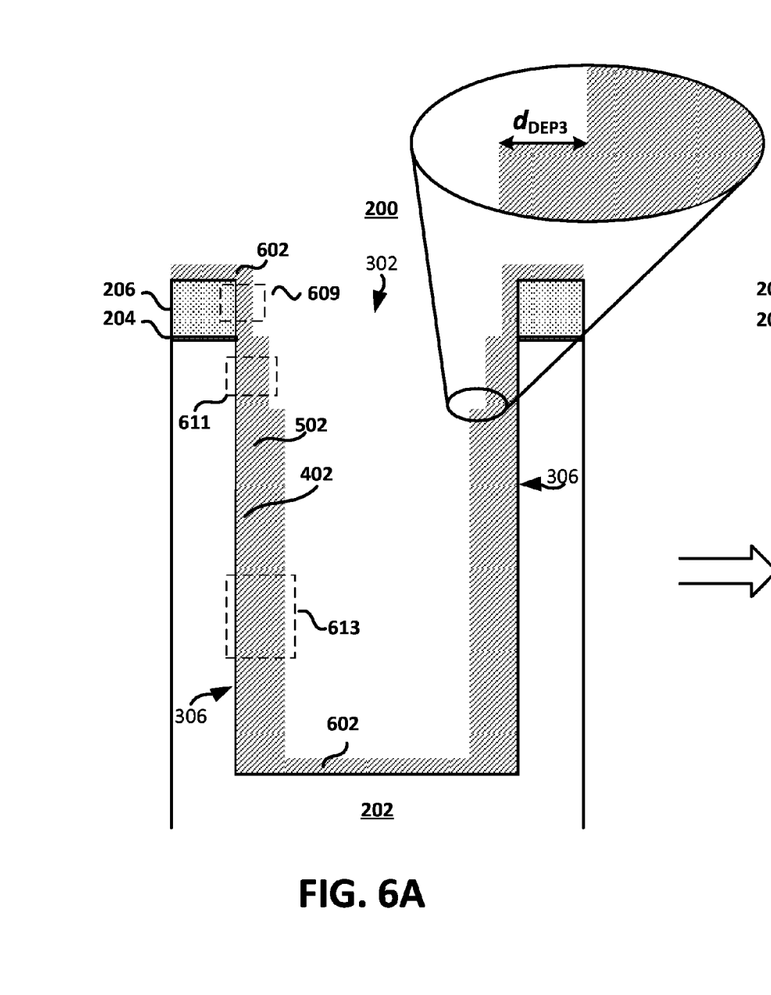
FIGS. 6A and 6B depict a third cycle of deposition and etching of an insulating layer according to the example process for forming the tapered field plate dielectric region.

FIG. 6A depicts substrate 200 after insulating layer 602 has been deposited on substrate 202. The process for depositing insulating layer 602 may be conformal so that approximately a thickness of $d_{DEP3}$ of insulating material 602 is deposited on both vertical and horizontal surfaces. Insulating layer 602 may be the same material deposited with the same technique to the same thickness as insulating layer 402 or insulating layer 502. In one alternative, as compared to the insulating layer 402 or insulating layer 502, insulating layer 602 may be a different material, deposited with a different technique, or have a different thickness. Portions of sidewalls 306 that did not have insulating layers 402 and 502 removed may now have approximately a total thickness of $d_{DEP1}+d_{DEP2}+d_{DEP3}$ of insulating material. However, portions of wafer 202 that are exposed at the bottom of trench 302 have a thickness of only approximately $d_{DEP3}$ of insulating material. As shown, a first region 609 includes only portions of insulating layer 602 and the insulating material is a thickness of $d_{DEP3}$. A second region 611 includes portions of insulating layer 402 and 602 and the total thickness of insulating material along sidewalls 306 in region 611 is $d_{DEP1}+d_{DEP3}$. A third region 613 includes portions of insulating layer 402, 502, and 602 and the total thickness of insulating material along sidewalls 306 in region 613 is equal to $d_{DEP1}+d_{DEP2}+d_{DEP3}$.

Figure 6B:
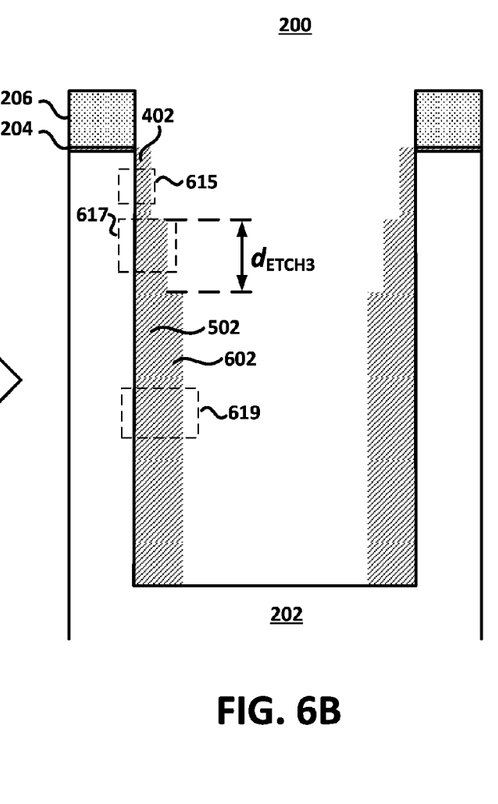

FIG. 6B depicts substrate 200 after etching a thickness, $d_{ETCH3}$, of insulating layer 602 (and some of insulating layer 402 and insulating layer 502) with an anisotropic etch (e.g., the same etch used to etch insulating layer 402 as discussed with respect to FIG. 4B). There is now a pillar of insulating layer 602 on a pillar of insulating layer 502, which is on a pillar of insulating layer 402. As shown, a first region 615 contains only insulating layer 402 and the insulating material in first region 615 is a thickness of $d_{DEP1}$. A second region 617 includes portions of insulating layers 402 and 502 along sidewalls 306 and the total thickness of insulating material in region 617 is $d_{DEP1}+d_{DEP2}$. A third region 619 includes portions of insulating layers 402, 502, and 602, and the total thickness of insulating material along sidewalls 306 in region 619 is equal to $d_{DEP1}+d_{DEP2}+d_{DEP3}$.

Figure 7:
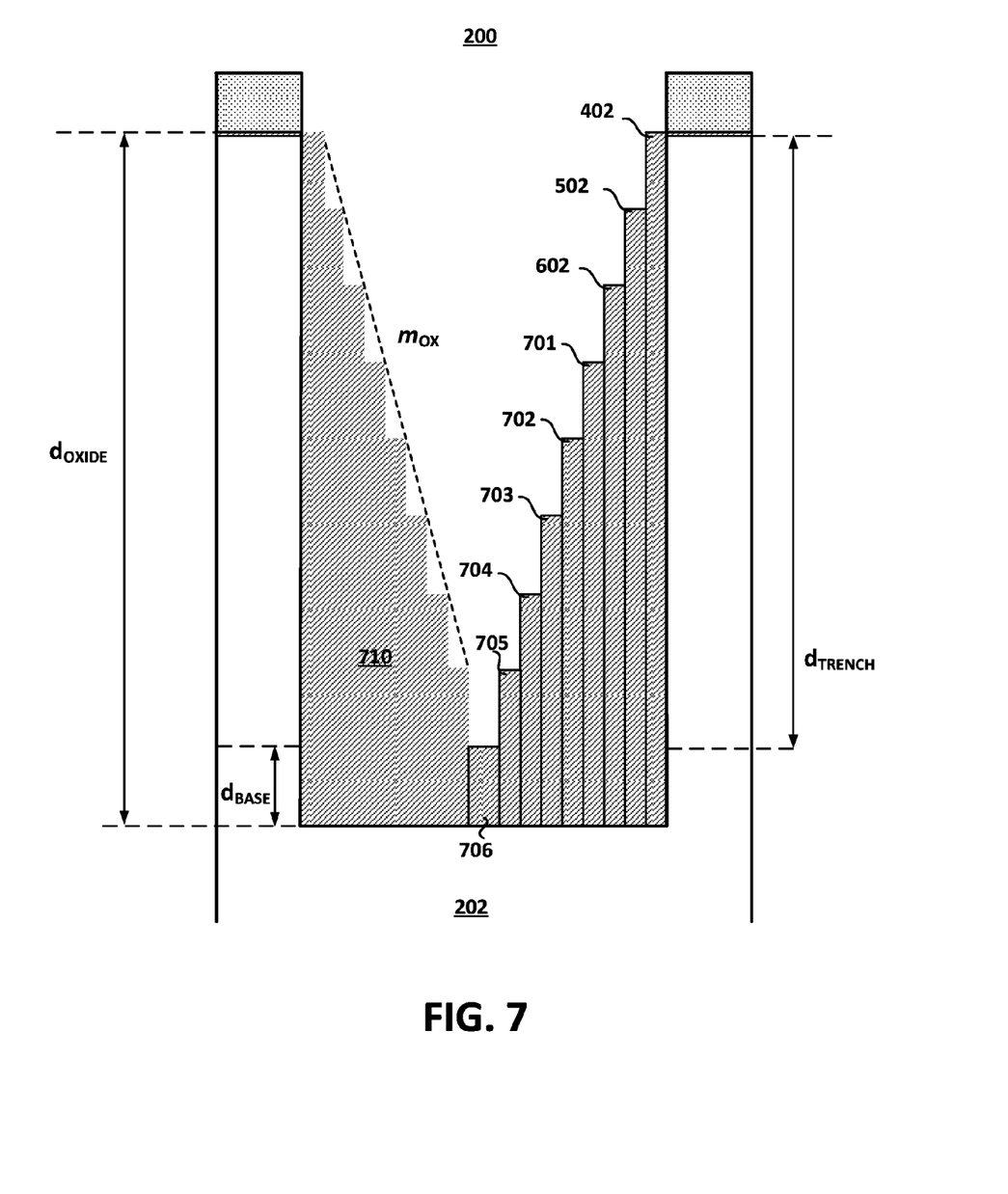
FIG. 7 depicts a tapered field plate dielectric region ready to receive a conductive material to form an example tapered field plate according the example process.

The process of depositing and etching dielectric, as depicted in and described with respect to any one the figure sets of FIGS. 4A-4B, FIGS. 5A-5B, and FIGS. 6A-6B, may be repeated as many time as necessary to fill trench 302. For example, as depicted in FIG. 7, nine cycles of depositing and etching were used to fill the trench depicted in FIG. 7. Specifically, the nine cycles are associated with insulating layer 402, 502, and 602 described above and six additional cycles that produce insulating layers 701-706. In cases where the deposit thicknesses are all approximately the same (e.g., $d_{DEP1}=d_{DEP2}=d_{DEP3}=d_{DEPX}$) and the etch amounts are all approximately the same (e.g., $d_{ETCH1}=d_{ETCH2}=d_{ETCH3}=d_{ETCHX}$), the slope, $m_{OX}$, of the tapered field plate dielectric region may be approximated by $d_{ETCHX}/d_{DEPX}$.

In other variations of the example process, the profile of the tapered field plate dielectric region may be different. For example, by using different thicknesses of insulating layers and etching different amounts of the insulating layers, the profile of the tapered field plate dielectric region may be controlled. In one instance, the profile of the tapered field plate dielectric region will have multiple different slopes along the profile of the tapered field plate dielectric region.

Figure 8:
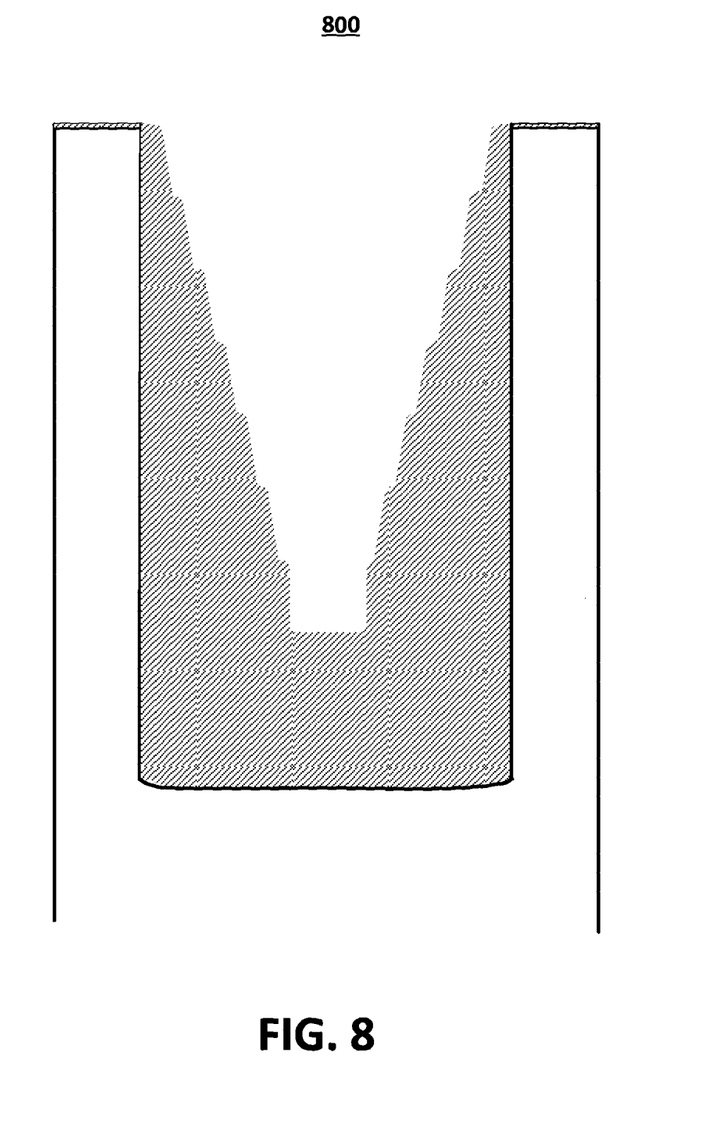
FIG. 8 depicts a cross-section of another tapered field plate dielectric region with a different profile.

The tapered field plate dielectric region has been depicted to have well-defined steps, with one step representing each deposition/etch cycle. However, in practice, it should be understood that the well-defined steps may not be present. For example, the profile of the tapered field plate dielectric region may have a more linear shape. FIG. 8 depicts substrate 800 that has another example of a profile for a tapered field plate dielectric that is not as ideal as the profile shown in FIG. 8.

Figure 9:
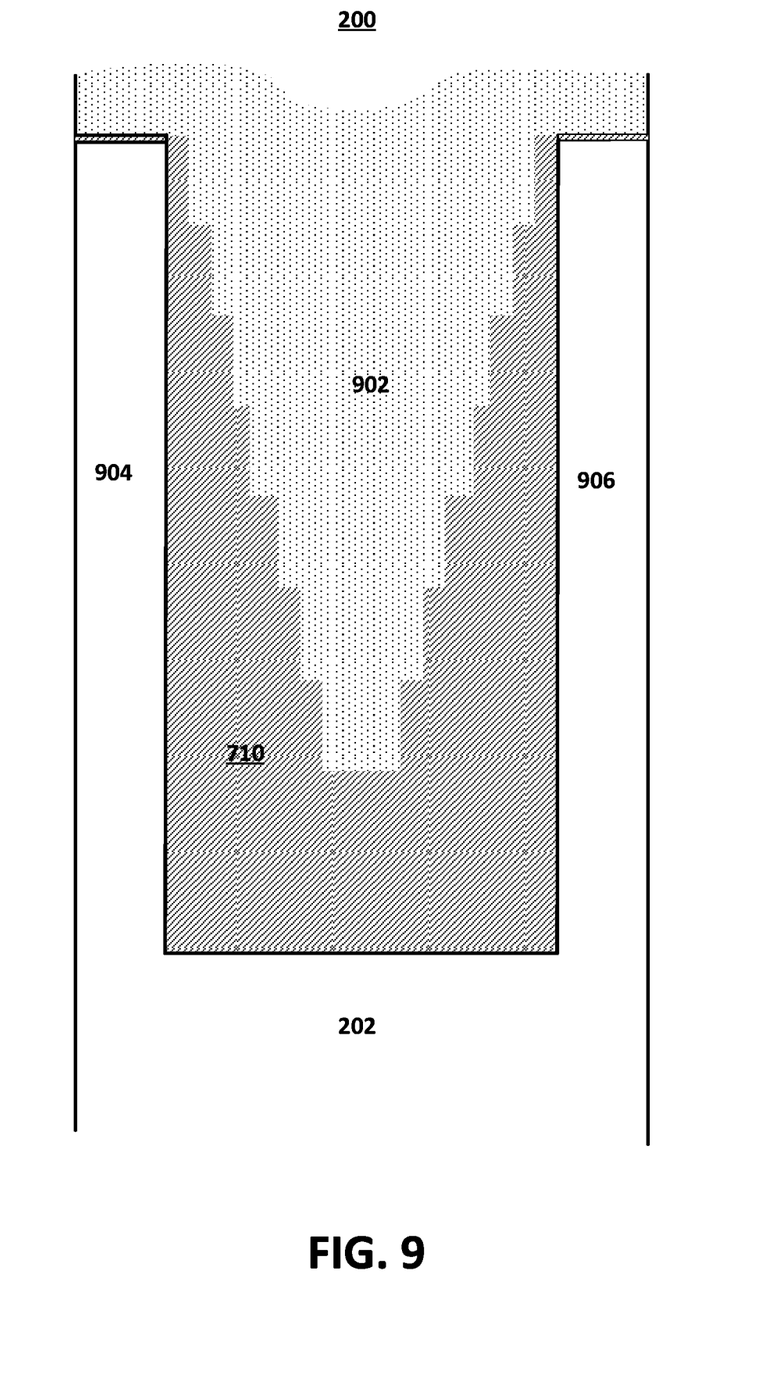
FIG. 9 depicts the conductive material deposited into tapered region formed by the tapered field plate dielectric region to form the tapered field plate dielectric region.

FIG. 9 depicts substrate 200 after deposition of conductive material 902 which fills the rest of trench 302 (not labeled) that was not filled by tapered field plate dielectric region 710. Conductive material 902 may be any number of materials, such as amorphous silicon, polycrystalline silicon, metal, and the like. If using a semiconductor for conductive material 902, then conductive material 902 may be in-situ doped as it is being deposited. The top of conductive material 902 may be then be planarized using a chemical mechanical polishing (CMP) or etch-back step. Electrical contact may then be made to the remaining portion of conductive material 902, which forms the tapered field plate.

Once the tapered field plate dielectric and tapered field plate have been formed, semiconductor device fabrication flows may be performed to form active devices in active regions of substrate 200 (e.g., pillars of silicon 904 and 906). For example, a VTS HVFET process may be used to form HVFETs in silicon pillars 904 and 906.

Figure 10:
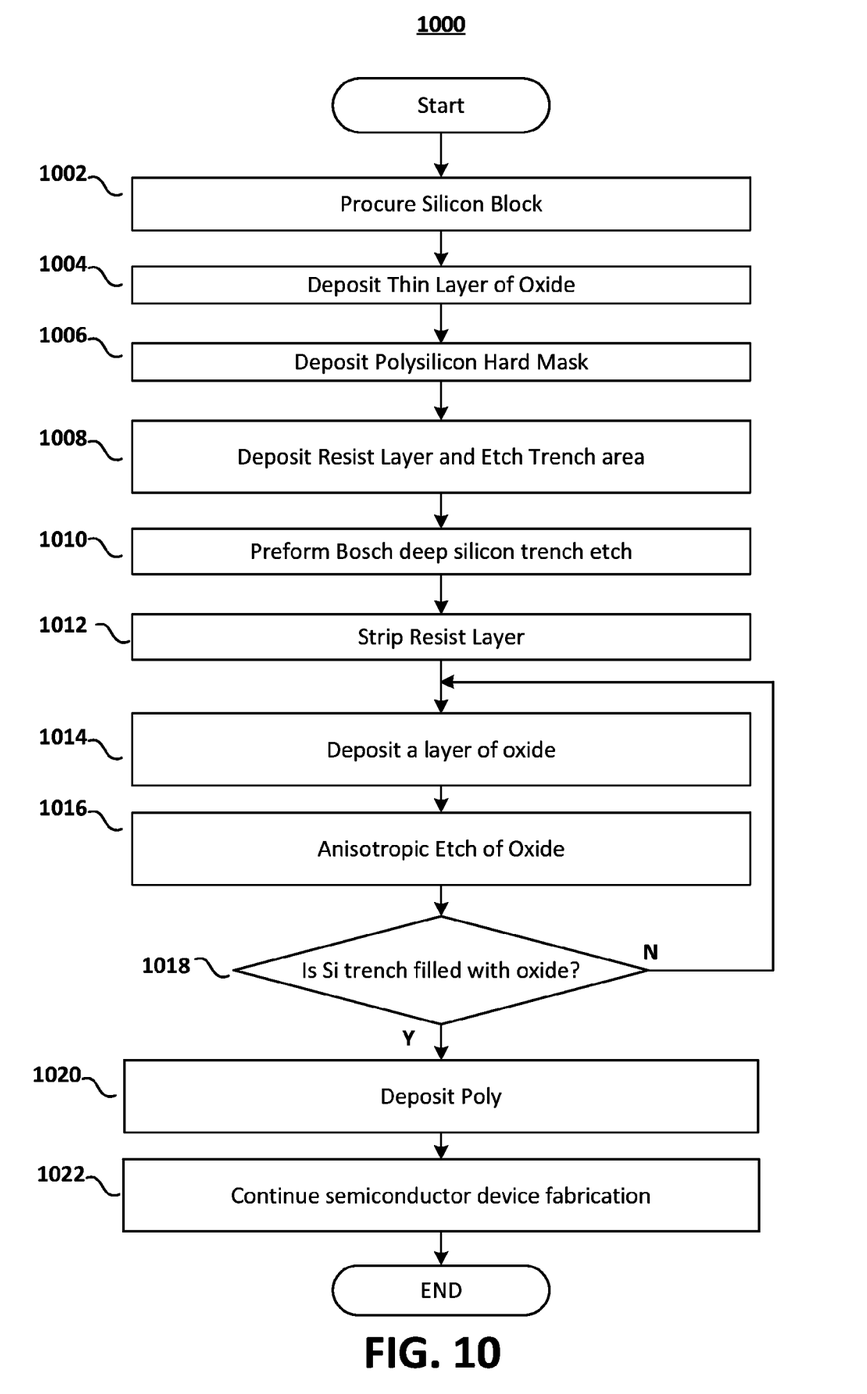
FIG. 10 depicts a flow chart for another example process for forming a tapered field plate dielectric region.

FIG. 10 depicts a flow chart for example process 1000 (similar to the example process described above with respect to FIGS. 2-9) for forming a tapered field plate dielectric region in a semiconductor substrate. In step 1002, a silicon wafer is obtained. The silicon wafer may have different layers of doping created with, for example, epitaxially grown layers of silicon. In step 1004, a thin layer of oxide is grown on the surface of the silicon wafer to form a protective layer that protects the surface of the silicon wafer from processing damage and debris. In step 1006, a polysilicon hardmask is deposited (e.g., see FIG. 2A). The polysilicon hardmask may be used throughout the formation of the tapered field plate dielectric region that surrounds the tapered field plate. Polysilicon may be preferred for the hardmask because etch recipes may be readily available that provide high selectivity to etching oxide (or other insulating materials) over polysilicon. In step 1008, the hardmask is then patterned and etched using a photolithography step (e.g., see FIGS. 2B and 2C). The hardmask now defines the area where the trench for the sloped field plate will be etched. In step 1010, a DRIE (or Bosch etch) step is performed to define the trench for the sloped field plate (e.g., see FIG. 3A). In some variations of example process 1000, steps 1008 and 1010 may be combined into one step. In step 1012, any photoresist that is left from steps 1008 or 1010 is removed with a plasma ashing step (e.g., see FIG. 3B). In step 1014, a layer of oxide is deposited over vertical and horizontal surfaces of the substrate, including the sidewalls and bottom of the trench formed in step 1010 (e.g., see FIGS. 4A, 5A, and 6A). In step 1016, an anisotropic etch is performed to remove a certain thickness of the oxide deposited in step 1014 (e.g., see FIGS. 4B, 5B, and 6B). Because the etch is anisotropic (i.e., substantially anisotropic), the oxide on horizontal surfaces of the wafer is completely removed while only the upper most portion of the oxide on vertical sides is removed. Accordingly, most of the oxide deposited on the sidewalls of the trench (e.g. all the oxide on the sidewalls except for the upper most portion) will remain. In step 1018, it is determined whether the trench is sufficiently filled with oxide to receive the material that forms the tapered field plate (e.g., see FIG. 7). For example, this may be determined based on the number of oxide dep/etch cycles that have been performed. As another example, cycles of steps 1014 and 1016 may be repeated until a threshold thickness of oxide remains in the center bottom of the trench after the oxide etch step 1016. In step 1020, once the tapered field plate dielectric has been formed in the trench, polysilicon is deposited in the trench to form the tapered field plate (e.g., see FIG. 9). A planarization step may be needed to ensure that the field plate and the surface of the wafer are coplanar. In step 1022 a semiconductor process flow is performed to form a HVFET in the silicon pillar adjacent the trench that contains the sloped field plate.

While example process 1000 has been described with respect to specific materials and layers, it should be understood that some layers may be optional and the materials of the wafer and layers may vary.

The above description of illustrated examples of the present invention, including what is described in the Abstract, are not intended to be exhaustive or to be limitations to the precise forms disclosed. While specific embodiments of, and examples for, the invention are described herein for illustrative purposes, various equivalent modifications are possible without departing from the broader spirit and scope of the present invention. Indeed, it is appreciated that the specific examples of thicknesses, materials, processing operations, etc., are provided for explanation purposes, and that other thicknesses, materials, processing operations, etc. may also be employed in other embodiments, examples, and processes in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A method of forming a tapered field plate dielectric region in a semiconductor wafer, the method comprising:
    etching a trench in the semiconductor wafer;
    depositing a first insulating layer with a first thickness in the trench;
    etching a first portion of the first insulating layer, wherein the first portion of the first insulating layer is disposed adjacent to the top of the trench;
    depositing a second insulating layer with a second thickness in the trench, wherein the second insulating layer overlaps at least a portion of the first insulating layer;
    etching a second portion of the second insulating layer, wherein the second portion of the second insulating layer is disposed adjacent to the top of the trench and adjacent to the top of the first insulating layer, and wherein at least some of the second insulating layer remains adjacent to the first insulating layer in the trench after etching the second portion of the second insulating layer;
    depositing a third insulating layer with a third thickness in the trench, wherein the third insulating layer overlap at least a portion of the second insulating layer, and wherein the first insulating layer, the second insulating layer, and the third insulating layer are of the same materials; and
    etching a third portion of the third insulating layer, wherein the third portion of the third insulating layer is disposed adjacent to the top of the trench, adjacent to the top of the first insulating layer, and adjacent to the top of the second insulating layer, and wherein at least some of the third insulating layer remain adjacent to the second insulating layer in the trench after etching the third portion of the third insulating layer.

2. The method of claim 1, wherein the first and the second and the third thicknesses are approximately the same.

3. The method of claim 1, wherein the first thickness is substantially independent of the slope of the surface that the first insulating layer is being deposited on.

4. The method of claim 1 further comprising:
prior to etching the trench, patterning a hardmask that defines the location of the trench, wherein the patterning the hardmask includes depositing a hardmask material.

5. The method of claim 4, wherein the hardmask material comprises polysilicon.

6. The method of claim 5 further comprising:
prior to patterning the hardmask, depositing a protection layer on the surface of the semiconductor wafer.

7. The method of claim 1, wherein the trench has a sidewall, and wherein the method further comprises:
depositing a conductive material on the first insulating layer and the second insulating layer in the trench, wherein the conductive material is separated from direct contact with the sidewall of the trench by the first insulating layer and the second insulating layer.

8. The method of claim 1, wherein etching the first portion of the first insulating layer and etching the second portion of the second insulating layer are done with an anisotropic etch.

* * * * *